United States Patent

Huang et al.

[11] Patent Number: 5,831,295
[45] Date of Patent: Nov. 3, 1998

[54] CURRENT CONFINEMENT VIA DEFECT GENERATOR AND HETERO-INTERFACE INTERACTION

[75] Inventors: Jenn-Hwa Huang, Gilbert; Saied N. Tehrani, Tempe, both of Ariz.

[73] Assignee: Motorola, Inc., Schaumburg, Ill.

[21] Appl. No.: 566,388

[22] Filed: Dec. 1, 1995

[51] Int. Cl.$^6$ ............... H01L 31/0328; H01L 31/0336; H01L 23/48
[52] U.S. Cl. .................. 257/192; 257/187; 257/751
[58] Field of Search .................. 257/187, 192, 257/200, 194, 486, 472, 751, 744, 745, 767

[56] References Cited

U.S. PATENT DOCUMENTS 5,049,951  9/1991  Goronkin et al. ............... 257/192
5,256,596  10/1993  Ackley et al. ............... 437/129
5,468,656  11/1995  Shreh et al. ............... 437/23
5,514,606  5/1996  Hashemi et al. ............... 437/41

Primary Examiner—Wael Fahmy
Attorney, Agent, or Firm—Eugene A. Parsons

[57] ABSTRACT

A semiconductor device including a plurality of layers of material defining a diffusion barrier. A defect generator positioned on the plurality of layers in overlying relationship to the diffusion barrier so as to produce a collection of defects at the diffusion barrier that operates as a current restriction. In a typical example, an ohmic contact is positioned around the mesa of a ridge VCSEL, which ohmic contact generates defects that accumulate at a hetero-interface near the active area and confine the current flow to a lasing volume of the VCSEL.

6 Claims, 1 Drawing Sheet

CURRENT CONFINEMENT VIA DEFECT GENERATOR AND HETERO-INTERFACE INTERACTION

FIELD OF THE INVENTION

The present invention pertains to current confinement in semiconductor structures and more specifically to the confining of current to specific operating regions in the semiconductor structure.

BACKGROUND OF THE INVENTION

In many semiconductor structures it is desirable to limit current flow in the semiconductor structure to specific operating regions. This is true, for example, when semiconductor devices are placed close together on a common substrate. In this instance it is desirable to prevent current from flowing between adjacent semiconductor devices. Also, in many semiconductor devices, such as vertical cavity surface emitting lasers (VCSELs), it is desirable to confine current flow to the lasing volume, since current outside the lasing volume generally produces unwanted lasing and wastes current.

In the prior art, current confinement is generally provided by implants of materials, such as beryllium, oxygen, hydrogen, etc. which are relatively costly because they require additional steps in the manufacturing process and costly machinery to perform the process. In some semiconductor structures current confinement is achieved by deep doping, oxidation, or the like. All of these schemes are costly and require additional process steps.

Accordingly, it would be highly advantageous to provide current confinement through less costly and complicated structure or methods.

It is a purpose of the present invention to provide new and improved structure for current confinement in semiconductor structures.

It is another purpose of the present invention to provide new and improved structure for current confinement in semiconductor structures which is relatively simple and inexpensive to fabricate.

It is still another purpose of the present invention to provide new and improved structure for current confinement in semiconductor structures which current confinement results from the provision of components of semiconductor devices in the semiconductor structure.

SUMMARY OF THE INVENTION

The above problems and others are at least partially solved and the above purposes and others are realized in a semiconductor structure including a plurality of layers of material defining a diffusion barrier. A defect generator is positioned on the plurality of layers in overlying relationship to the diffusion barrier so as to produce a collection of defects at the diffusion barrier that operates as a current restriction. In a typical example, an ohmic contact is positioned around the mesa of a ridge VCSEL, which ohmic contact generates defects that accumulate at a hetero-interface near the active area and confine the current flow to a lasing volume of the VCSEL. In a second example, a defect generator is positioned between adjacent semiconductor devices on a common substrate to form a current restriction therebetween.

BRIEF DESCRIPTION OF THE DRAWINGS

Referring to the drawings.

DESCRIPTION OF THE PREFERRED EMBODIMENTS

Figure 1:
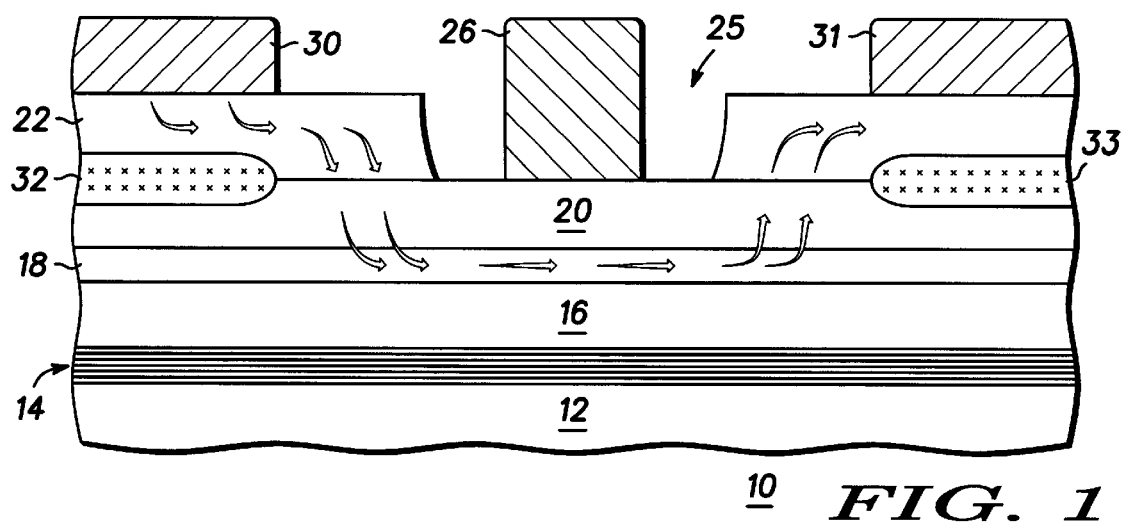
FIG. 1 is a sectional view of an embodiment of a semiconductor structure incorporating the present invention.

Referring specifically to FIG. 1, a semiconductor structure 10 is illustrated which includes a supporting substrate 12 that may be basically any layer or structure that serves as a support for the remaining portions of structure 10. In this example one or more buffer layers 14 are formed on the upper surface of substrate 12 and serve to crystalographically lattice match the remaining portions to substrate 12 and to each other. A plurality of layers of semiconductor material are stacked together on buffer layer 14, which plurality of layers include, in this specific example, a first layer or group of layers 16, one or more conductive layers 18 and a second layer or group of layers 20 with a contact layer 22 on the top. For convenience of this explanation, each of these will hereafter be referred to as a single layer.

Contact layer 22 is patterned to define an operating region, generally designated 25, and may include, for example, a gate contact 26 or other control terminal for controlling electrical conduction in operating region 25. In many devices and/or applications it is desirable to limit electrical current to only operating region 25 or to provide additional limitations on the size of operating region 25. As one simplified example, when semiconductor structure 10 is a field effect transistor or the like, limiting the size (horizontal length) of the gate area can increase the speed and frequency characteristics of the transistor.

To this end a defect generator is mounted on the upper surface of contact layer 22. In this specific example the defect generator includes ohmic contacts 30 and 31 (e.g. a source and/or drain contact), which generate defects that collect at a hetero-interface between layers 20 and 22, at areas generally designated 32 and 33, respectively. Generally, the defects are generated during the fabrication of the ohmic contact or contacts. It has been found that the defects travel a distance of 300 angstroms to 1000 angstroms into the material and may diffuse in a lateral direction as much as 2 microns. The hetero-interface between layers 20 and 22 forms a natural diffusion barrier to the defects so that most or all of the defects collect in areas 32 and 33. A depletion layer is formed around the defects, which essentially forms a p-n junction. A Schottky behavior occurs due to the effective p-n junction, which Schottky behavior essential prevents electrical current from traveling through areas 32 and 33. Thus, current flow is limited or restricted to operating region 25.

In one specific example, layer 20 is formed of aluminum-gallium-arsenide (AlGaAs), layer 22 is formed of gallium-arsenide (GaAs) heavily doped (N+) for N-conduction, and ohmic contacts 30 and 31 are formed of nickel-germanium-tungsten (Ni—Ge—W). Defects are generated by a reaction between GaAs and Ni—Ge—W. During this reaction NiGe breaks the GaAs bond and forms a NiGeAs phase. The excess gallium forms defects or precipitates, which are possibly Ga+. The defects, or Ga, that is formed during this reaction diffuses to the hetero-interface since it can not diffuse into tungsten (ohmic contacts 30 and 31), which is a known diffusion barrier, and a depletion layer or region is formed around the defects.

Figure 2:
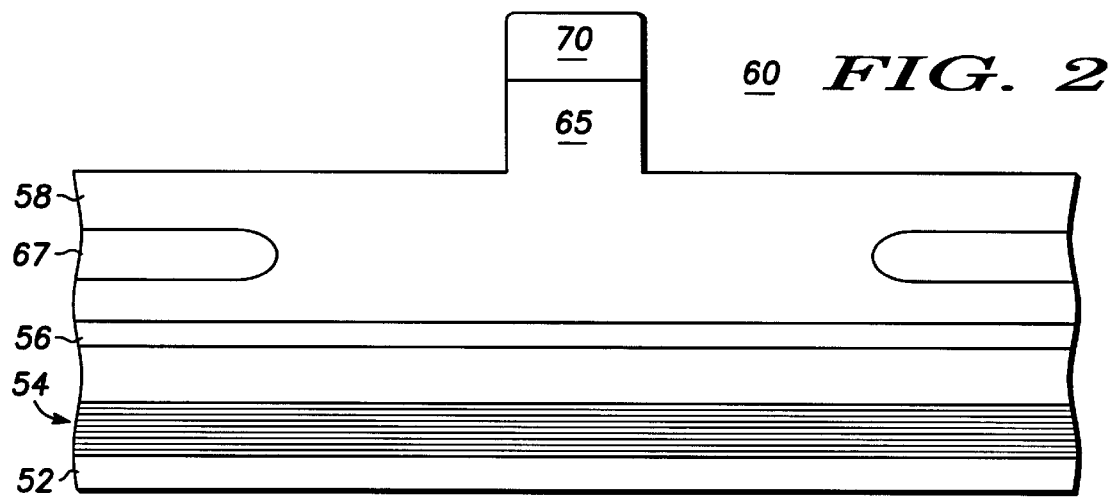
FIG. 2 illustrates a specific embodiment of an intermediate, simplified sectional view of a top emitting VCSEL incorporating the present invention.

Referring specifically to FIG. 2 as another example of an embodiment of the present invention, an intermediate structure in the manufacture of a top emitting vertical cavity surface emitting laser (VCSEL) 50 is illustrated in a sectional view. Laser 50 is formed on a substrate 52, which in this example, is made of p-doped gallium arsenide. Deposition of alternating layers of p-doped aluminum (or aluminum gallium arsenide with a different aluminum mole fraction) gallium arsenide and aluminum arsenide form a first stack 54 of reflectors or mirrors for laser 50. An active region 56 (including an active layer, spacers and/or cladding layers on each side, etc.) is deposited on the upper surface of first mirror stack 54. A second stack 58 of reflectors or mirrors is epitaxially deposited on active region 56. Detailed construction of first mirror stack 54, active region 56 and second mirror stack 58 is presented in U.S. Pat. No. 5,034,092, entitled "Plasma Etching of Semiconductor Substrates", issued Jul. 23, 1991, assigned to the same assignee and included herein by reference.

Once first mirror stack 54, active region 56 and second mirror stack 58 are completed, the structure generally will be patterned to form one or more individual ridge VCSELS. In the present specific embodiment the patterning is accomplished as follows. The upper surface of second mirror stack 58 is provided with a layer of photoresist 70, alone or in combination with oxynitride material in any of the well known methods. Photoresist layer 70 is exposed and material is removed to define the position and size of a trench 60. Trench 60 is then formed by etching mirror stack 58 by any convenient means, such as ion milling or the etch processes disclosed in the above identified patent '092. In general, trench 60 extends completely around and defines an operating area, or mesa, 65, which in this specific embodiment has a generally circular cross-section.

In this specific embodiment, trench 60 extends into mirror stack 58 from the upper surface thereof, to a depth of almost one half the complete dimension of first mirror stack 54. While this depth is convenient for reasons that will become apparent presently, it is only necessary that trench 60 be sufficiently deep to reduce reflectivity of mirror stack 58 in the volume between the bottom of trench 60 and active region 56 so that a non-lasing volume is produced beneath trench 60. The non-lasing volume surrounds a lasing volume below mesa 65, which lasing volume is substantially coaxial with mesa 65. In at least some applications lasing will not be supported when the reflectivity is reduced to less than approximately 98%. A complete disclosure of the construction of laser 50 with mesa 65 is available in U.S. Pat. No. 5,256,596 entitled "Top Emitting VCSEL With Implant", issued Oct. 26, 1993 and assigned to the same assignee.

In the '596 patent, with trench 60 formed to the desired depth, a deep implant of an impurity or doping material, such as beryllium, etc., is made in second mirror stack 58 to form a buried implant layer 67 in the non-lasing volume of second mirror stack 58. Typically thick photoresist or silicon oxynitride layer 70 is used both as the mask for etching trench 20 and as a mask for implanting the impurity. The impurity is chosen to produce a conductivity different from the conductivity of second mirror stack 58. In the specific embodiment illustrated, second mirror stack 58 has n-type conductivity and implant layer 67 has p-type conductivity. Further, in this specific embodiment beryllium is used as the impurity to achieve the deepest buried implant because it is the lightest generally used impurity.

The implant, whether beryllium or hydrogen, has the disadvantage of not being a good insulating material at high temperatures (i.e. >500° C.). This will limit the maximum temperature to which subsequent process modules can be subjected. An additional problem is that it is difficult to control the depth of the implanted beryllium or hydrogen. Also, the implanting process requires an additional mask set and implanting equipment, and there is always the possibility of misalignment between implant layer 67 and the final ohmic metal layer.

Figure 3:
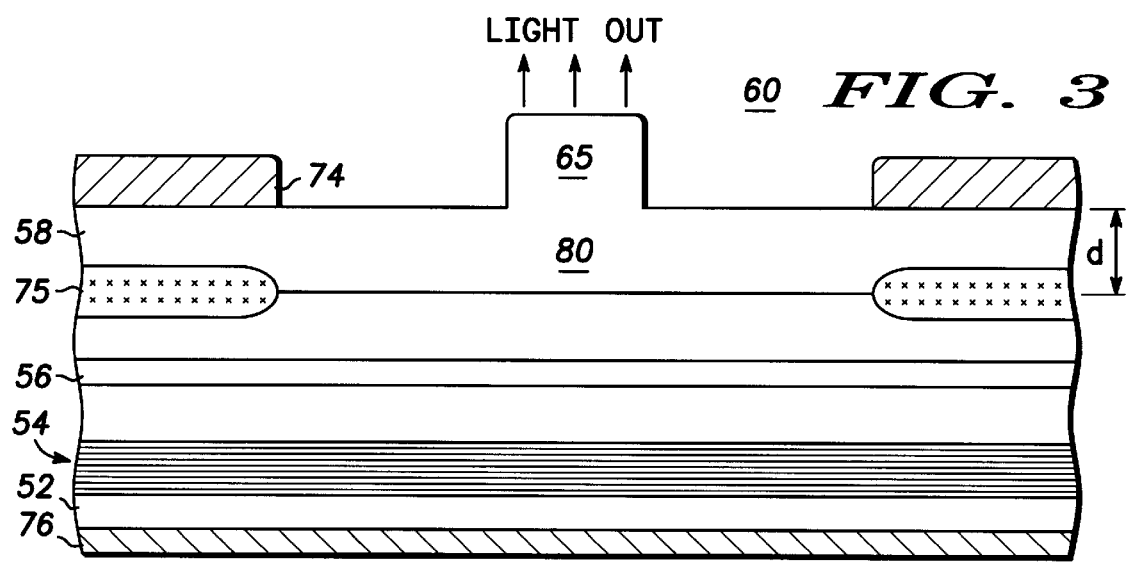
FIG. 3 is a view similar to FIG. 2 of a completed structure.

In the present process, with trench 60 formed to the desired depth, a defect generator is positioned on the surface of second mirror stack 58 in trench 60, which defect generator in this specific embodiment is an ohmic contact 74, as illustrated in FIG. 3. Defects are formed automatically during the formation of ohmic contact 74, which defects collect at the diffusion barrier formed by the hetero-interface between active region 56 and second mirror stack 58. The hetero-interface between active region 56 and second mirror stack 58 forms a natural diffusion barrier to the defects so that most or all of the defects collect in area 75. As explained above, the depth 'd' to which the defects will travel is in the range of approximately 300 angstroms to 1000 angstroms and the defects may diffuse in a lateral direction as much as 2 microns. A depletion layer is formed around the defects, which essentially forms a p-n junction. A Schottky behavior occurs due to the effective p-n junction, which Schottky behavior essential prevents electrical current from traveling through area 75. Thus, current flow is limited or restricted to an operating region 80 generally defined by area 75 and mesa 65.

Accordingly, new and improved structures for current confinement in semiconductor structures have been disclosed, which structures are relatively simple and inexpensive to fabricate because the current confinement results from the provision of components (e.g. ohmic contacts) of semiconductor devices in the semiconductor structure. Because the components actually generate the current confinement, no additional steps, such as masking, implanting, annealing, or the like are required.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. In a semiconductor structure, a plurality of layers of semiconductor material defining at least one semiconductor device, the plurality of layers of semiconductor material further defining a hetero-interface that operates as a diffusion barrier, and a defect generator positioned on the plurality of layers of semiconductor material in overlying relationship to the diffusion barrier so as to produce a collection of defects at the diffusion barrier that operates as a sole current restriction, the diffusion barrier further positioned to circumscribe the semiconductor device so as to restrict current to an operating region of the semiconductor device and prevent current from flowing between the semiconductor device and adjacent semiconductor devices.

2. A semiconductor structure as claimed in claim 1, wherein the defect generator includes an ohmic contact.

3. A semiconductor structure as claimed in claim 2, wherein the ohmic contact includes a layer of nickel-germanium-tungsten.

4. A semiconductor structure as claimed in claim 3, wherein at least one of the plurality of layers of material defining the hetero-interface includes gallium-arsenide.

5. A semiconductor structure as claimed in claim 4, wherein the collection of defects at the diffusion barrier form a depletion region that operates as the current restriction.

6. A semiconductor structure as claimed in claim 4, wherein the nickel-germanium-tungsten ohmic contact reacts with the gallium arsenide to produce nickel-germanium-arsenide and gallium, with the gallium forming defects that accumulate at the hetero-interface.

* * * * *